United States Patent [19]

Kuehnle

[11] 4,331,526
[45] May 25, 1982

[54] CONTINUOUS SPUTTERING APPARATUS AND METHOD

[75] Inventor: Manfred R. Kuehnle, New London, N.H.

[73] Assignee: Coulter Systems Corporation, Bedford, Mass.

[21] Appl. No.: 78,377

[22] Filed: Sep. 24, 1979

[51] Int. Cl.³ .............................................. C23C 15/00
[52] U.S. Cl. ................................. 204/192 R; 204/298
[58] Field of Search ........................... 204/192 R, 298

[56] References Cited

U.S. PATENT DOCUMENTS

| | | | |
|---|---|---|---|
| 3,205,086 | 9/1965 | Brick et al. ...................... | 118/718 X |
| 3,409,529 | 11/1968 | Chopra et al. ..................... | 204/192 |
| 3,645,545 | 2/1972 | Garnache et al. ............... | 277/725 R |
| 3,884,787 | 5/1975 | Kuehnle .............................. | 204/192 |
| 3,945,911 | 3/1976 | McKeluey ......................... | 204/298 |
| 3,968,018 | 7/1976 | Lane et al. ......................... | 204/192 |
| 4,107,350 | 8/1978 | Berg et al. ......................... | 427/38 |

FOREIGN PATENT DOCUMENTS

| | | | |
|---|---|---|---|
| 52-5682 | 1/1977 | Japan ................................. | 204/298 |
| 465445 | 8/1975 | U.S.S.R. ............................. | 204/298 |

OTHER PUBLICATIONS

S. Hurwitt et al., "What is 'In-Line' Sputtering?", *Research/Development*, Apr. 1975, pp. 43–44.

*Primary Examiner*—Delbert E. Gantz
*Assistant Examiner*—William Leader
*Attorney, Agent, or Firm*—Silverman, Cass & Singer, Ltd.

[57] ABSTRACT

An R.F. Sputtering apparatus operable on a flexible continuous substrate. The substrate is suitable conditioned in a conditioning vessel, then passed through a sputtering vessel between spaced electrode pairs. Each pair consists of a target (cathode) and an anode. Each pair is independently energized from an r.f. source. Air locks are provided which enable substrate movement between and through the vessels without change of pressure and other physical conditions therewithin. Access doors or closures are provided over manholes which enable the targets to be serviced, replaced, etc.

Targets may be uppermost or lowermost; individual match boxes are provided for each electrode pair; heating and drive means may be provided in the main sputtering chamber; bias means may be provided for the anodes; support and/or tension controlling rollers may be provided in the sputtering chamber; and a vacuum cleaning system is provided to remove extraneous particles, dust, etc.

29 Claims, 6 Drawing Figures

CONTINUOUS SPUTTERING APPARATUS AND METHOD

FIELD AND BACKGROUND OF THE INVENTION

The field of the invention comprises r.f. sputtering apparatus of the type which is intended primarily to sputter a coating of insulating photoconductive material upon a conductive substrate. The conductive substrate may comprise a synthetic resin web of material such as polyester or other polymer with an ohmic layer thereon or it may comprise a web of paper or of metal. The substrate is flexible to the extent that it can be moved through the apparatus at speed through the use of rollers and similar guiding, driving, tension control and direction changing means.

With respect to the background of the invention, it is clear that batch types of sputtering equipment and apparatus are limited in throughput. Where the supply and takeup reels must be located within the apparatus, after the total amount of substrate that can be handled within the apparatus has been coated, it is necessary to stop the operation of the machine or device and open the chamber so that the coated material can be removed. The supply reel must then be replenished; the end must be threaded through the sputtering electrodes and over the rollers and guide means and connected to the takeup mechanism; the chamber must be closed and sealed; the atmosphere must be pumped down; the background gas must be started up and adjusted for proper pressure; the electrical system must be connected and tuned; the parameters such as temperature, pressure, etc., must be adjusted for steady state conditions; the drive mechanism for the movement of the substrate must be started up; and perhaps many other functions must be performed before the coating can start. At that, there is no assurance that the properties of the resulting coated substrate will be the same as the coated substrate which resulted from the previous run or the same as the coated substrate that will result from the following run.

There is considerable loss of time in this procedure which has been described and which results in no product until steady state is reached. The invention herein is concerned with the commercial production of substrate which has been coated with insulating photoconductive material of the type which is disclosed in some detail in U.S. Pat. No. 4,025,339. The more familiar type of sputtering apparatus which uses bell jars and small chambers and which produces small several square centimeter rectangles or discs of sputtered material for each hour of use are of no value in achieving a throughput which can supply users with large quantities of electrophotographic material.

Several types of apparatus which are of the batch variety are disclosed in U.S. Pat. Nos. 3,829,373; 3,884,787; 3,905,887; 4,013,539; 4,014,779; and 4,026,787. Most of these patents include in their disclosures practical devices which are constructed in such a manner as to contain the supply and takeup reels and are thus strictly batch process apparatus. It is true that large reels of substrate can be coated in these devices, but again the need for stopping the process when the entire supply reel has been used up is expensive, time consuming and annoying. In U.S. Pat. Nos. 3,829,373; 3,884,787; 3,905,887; 4,013,539; and 4,026,787 continuous process coating apparatus is disclosed, but in every instance the substrate is led around a drum on the interior of the sputtering chamber. In an effort to obtain more than one turn around the drum, complicated mechanisms are suggested for shifting the turns of the substrate as it loops around the drum, but this must be limited to narrow strips and is well-nigh impossible for coating wide webs of substrate of the order of a meter and more in width.

It has been found that r.f. electrodes are required to be spaced sufficiently apart to avoid interference. This factor either would limit the number of electrodes or would dictate the provision of a huge drum.

Coating a web of substrate in a chamber which requires that the substrate move once around a drum has considerable limitations in the throughput even assuming that the substrate enters and leaves by way of air locks so that the process is continuous rather than batch-type in operation. Since the drum is normally the anode, the size of the drum for practical purposes is limited because its diameter will dictate to a large extent the size of the chamber and the apparatus itself. The largest known drums which are used in batch processes are of the order of a meter or so in diameter and perhaps a meter or so in axial length. The plasma which is developed between the targets which face the circumference of the drum is therefore limited by the amount of target area which can be disposed around the drum. For even the largest known drums, the target area is quite limited and hence the speed of movement of the substrate is also limited.

Given a drum which is about a meter in diameter, the application of a coating of cadmium sulfide of about 4000 A thick by means of twelve targets along the circumference of the drum can be effected in one pass at a speed not exceeding about 3 or 4 millimeters per second. To increase the throughput would require enormous drums with a substantial increase in the floor space, expense, problems of pump-down and introduction of background gas, problems of power transfer, etc.

In the case of substrates which require multiple coatings of different materials, as for example, that electrophotographic material disclosed in said U.S. Pat. No. 4,025,339 which is based upon a polyester substrate having a coating of indium-tin oxide of about 200 A thick on the substrate covered with a second coating of cadmium sulfide about 3000 A or more thick, it is difficult to produce the same in a single pass in apparatus which has a drum anode. This is true whether the apparatus is of batch type or continuous. The reason is that the space available along which to effect the principal coating is limited so that there is insufficient circumferential distance to provide for two or more different materials to be sputtered in the single pass around the drum.

Another problem which arises with an attempt to coat more than one material in a single pass in a single chamber is that contamination results. It is impossible fully to confine the sputtering plasma; hence if one would sputter a conductor like indium-tin oxide at one or two of the first reached targets and then sputter an insulator like cadmium sulfide in the remaining targets there is certain to be cross contamination. The stoichiometry of the photoconductor must be well-nigh perfect for the characteristics which are needed for proper charging, imaging, toning, etc. Adding even the most minute quantity of a conductor will destroy the stoichiometry.

In certain processes, before the ohmic layer of indium-tin oxide is applied, there is a flash of the photoconductive material of perhaps 30 A or so applied in the sputtering apparatus. In applying this thin layer, the substrate is moved through the plasma clouds at very high relative speed compared with the speed used to apply the main coating of photoconductive material.

As a result of these problems, it is common practice for the production of an electrophotographic member comprising a web of polyester with a photoconductive coating to pass the reel or spool of material through a sputtering machine three times. Each time a separate coating or layer is applied, the first being the flash of cadmium sulfide for example, the second being the ohmic layer and the third being the photoconductive coating. This requires handling the material three times and besides the problems of opening the macines to remove and install the spools or reels, in handling the material in air there is contamination because of moisture and impurities in the atmosphere of the room where the apparatus is located. Purifying the air and conditioning it to obviate this contamination poses additional problems and expense.

The invention solves all of the problems which have been described and also engenders additional advantages which will become apparent as the description proceeds. Whether the substrate requires three coatings as in the case of an insulating web of polyester or one or two as in the case of a web of tin plated steel or stainless steel, everything can be effected in a single pass and continuously without shutting down the apparatus until hundreds or even thousands of meters or substrate have passed through. The conditions under which the sputtering is carried on are uniform and maintained constant; any number of processes can be performed on the substrate while it is moving through the apparatus; the thickness of the coating can be controlled either by the speed of the substrate or the length of the apparatus. In the latter case, the apparatus can be made out of uniform and easily fabricated modules that are connected together by air locks. Certain types of apparatus which are commercially available for handling webs, as for example, tension controlling means and drive means can be used for moving the web through the apparatus and guiding and controlling it. The speed of sputtering is only limited by the length of the apparatus and can be substantially more than ten millimeters per second.

Prior art which is known to the applicant in addition to the above mentioned patents comprises the following U.S. Pat. Nos.:

2,965,067, Amelotte et al.
2,989,026, Gardner et al.
3,294,670, Charschan et al.
4,009,090, Veigel Applicant does not represent that this is a comprehensive list of the prior art; that the art represented by these patents is analogous to the invention or the field of the invention herein; or that the explanation of the patents is to infer that there is any pertinence thereto.

Amelotte et al. is for a vacuum coating apparatus in which a substrate moves between chambers of different pressure.

Gardner et al. discloses another continuous vacuum coating apparatus.

Charschan et al discloses apparatus and a method for sputtering conductive material at d.c. from a vertical cathode that is not shielded onto a sequence of independent rigid substrate members in carriers that are pushed along a path which carries them through a series of low pressure chambers. No r.f. is involved; no insulating material is sputtered; there is no continuous web of substrate material; the substrate members are not flexible; the system is impractical for use with a wide web of substrate material which must be sputtered at high speed.

Veigel teaches a sputter-coating process for putting a coating on glass sheets which are individual but move in a continuous line through a plurality of chambers.

The process and apparatus of the invention is different from any of these disclosures because the extremely difficult problems which are inherent in sputtering photoconductive coatings are in no way involved in these references and certainly are not solved thereby. Vacuum deposit is a totally different field with different requirements and different apparatus. The Veigel patent sputters conductive materials by means of d.c. power which will not operate to sputter insulating materials such as cadmium sulfide.

SUMMARY OF THE INVENTION

Apparatus for the continuous sputtering of a substrate with at least a coating of an insulating material by means of r.f. megahertz energy.

The apparatus provides for the substrate being driven through the apparatus in a continuous process, entering the several modules or sections of the apparatus by means of air locks, passing between modules, if multiple modules are used, by air locks and leaving the apparatus by way of air locks so that a proper sputtering atmosphere may be maintained within the sputtering module or modules. Modules or sections of the apparatus may provide for the conditioning of the substrate before the sputtering occurs. Means are provided for maintaining proper tension on the substrate, for maintaining proper conditions uniformly within the apparatus, for transferring r.f. energy to the electrode systems or pairs within the apparatus efficiently and for tuning the same, for adjusting the targets, for applying bias to the anodes, for heating the substrate if needed, for applying more than one layer or coating to the subtrate as it passes through the apparatus without contamination or loss of stoichiometry.

One feature of the invention provides for the apparatus to have a low profile so that it can be serviced easily; for there to be a trap door or closure in the vicinity of each target to enable rapid servicing of the targets; for targets to be mounted on the trap doors or closures along with the match boxes so that when the closures are opened the entire target and match box is exposed.

Another aspect of the invention is the provision of raising and lowering means mounted on a carriage which travels along a track along the apparatus whereby to facilitate removal and replacement of targets through said doors or closures.

The invention also extends to a method of sputtering an insulating coating upon a web of substrate material in a continuous process.

DESCRIPTION OF THE PREFERRED EMBODIMENTS

The invention is concerned with the high speed production of sputtered material, for example, electrophotographic material, in the form of an elongate web coated with at least a photoconductive substance. Examples of this type of material comprise elongate webs of thin sheet metal such as tin plated steel or stainless steel which have been coated with a coating of cadmium sulfide that is from several thousand angstroms to about a micron thick. Another example is a web of polyester than is a fraction of a millimeter thick and transparent having a flash coating of cadmium sulfide that is about 30 angstroms thick followed by an ohmic layer of indium-tin oxide that is about 200 angstroms thick and having a top coating of cadmium sulfide that is from about a thousand angstroms to somewhat less than a micron thick.

These webs may be as much as several meters wide and as long as hundreds if not thousands of meters. The invention is a continuous process and hence the only limitations on the length of the web can be coated revolve around the problems of handling spools or reels of the material by material handling equipment. Unlike batch process apparatus, the operation of the apparatus of the invention is not required to be stopped to change supply and takeup reels within the apparatus. The size of the spool or reel of coated substrate may be very much larger than the cross sectional area of the sputtering apparatus of the invention.

The last coating upon the substrate in every case is an insulating material, which may not necessarily be a photoconductor, but which requires a sputtering atmosphere on the interior of the apparatus and r.f. energizing of the electrodes. In the case of cadmium sulfide the atmosphere in the sputtering chamber or chambers will be argon for ionization, hydrogen sulfide for ensuring stoichiometry of the deposit and oxygen in small quantities for producing a surface barrier layer on the cadmium sulfide. Other gases may be required for other materials. Dopants may be introduced in gaseous form or by inclusion in or on the targets.

The r.f. power which is applied to the target systems or pairs of targets is at a frequency of megahertz, usually 13.56 megahertz. Megahertz power requires critical considerations of matching the targets to the power source, tuning, interaction between targets, etc. In the case of the invention, the arrangement is ideal because each of the targets can be spaced along the length of the apparatus in such a manner and with such distance that there is no criticality in the tuning. They need not be close enough to react with one another as is often the case where the anode is a drum and the circumferential distance is so limited that one wishes to place the targets as close together as possible.

Furthermore, the targets can be of totally different materials without problems. For example, they can be spaced further apart than targets which are of the same material; they can be separated by nonsputtering modules or sections of the apparatus; they can be maintained in different chambers that are separated by air locks whereby totally different conditions may obtain in the respective chambers.

The whole picture of the invention provides a remarkable flexibility without losing the advantages of high speed continuous production of coated substrate.

Before describing the invention in detail it is deemed of benefit to give some typical dimensions so that it will be appreciated that the size of the apparatus is substantially greater than any r.f. sputtering in the prior art. So far as known, there has never been sputtering apparatus of this size that is now feasible because of the invention and for producing coated webs of substantial size.

As mentioned, the webs that can be and have been coated by the apparatus of the invention are upwards of one meter wide and have been as much as several meters wide. A typical apparatus for transporting and sputtering a web of substrate material can be about 11 meters long and the sputtering module containing four electrode pairs, each comprising a cathode opposite an anode can be about 28 meters long. The cathodes and anodes are relatively narrow in the direction that the web of substrate moves and are from ten to twenty centimeters wide in this direction. They are as long transversely of the web as the web itself.

Figure 1:
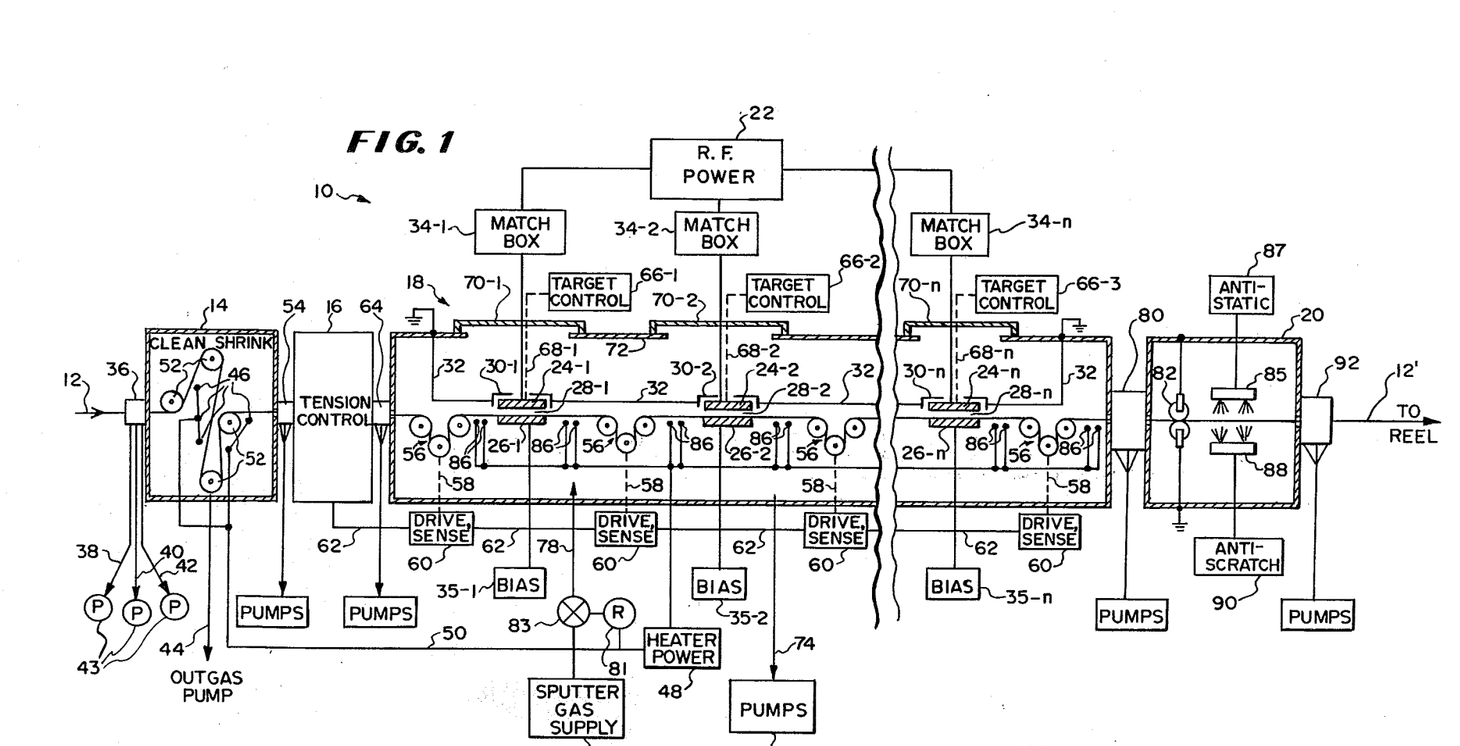
FIG. 1 is a schematic vertical sectional view of an apparatus which is constructed according to the invention in which many of the components and parts are shown in blocks and/or symbolically.

Looking now at FIG. 1 there is illustrated apparatus 10 which comprises a continuous sputtering apparatus in which an uncoated substrate web 12 enters on the left and emerges as the coated web 12' at the right.

The substrate is an elongate endless member either of flexible synthetic resin such as polyester or other polymer or a metal web made out of tin plated cold rolled steel, hot rolled steel with some form of plating or stainless steel. The width of the web 12 may be of the order of meters and it passes through the apparatus 10 with the aid of various driving, guiding and supporting means not all of which are illustrated but will be understood by those skilled in this art.

According to the illustration of FIG. 1, the apparatus 10 is formed of four modules or vessels designated 14, 16, 18 and 20 and includes ancillary equipment which is necessary for the continuous operation of the apparatus. It is emphasized that so long as there is substrate available the apparatus may be continued in this operation to produce the coated substrate or web 12'.

Among the auxiliary apparatus there are pumps, gas supply means and electrical equipment. The electrical equipment especially is of importance because its nature is such that many problems arise due to is megahertz frequency and the need to transfer substantial amounts of power efficiently.

In FIG. 1 the electrical equipment is shown in block form with connections represented by simple lines or channels but it must be understood that there are other components not illustrated. The source of power is shown at 22 and this will normally be a generator producing r.f. power at 13,56 megahertz to be fed to the electrode pairs which will be described. Each electrode pair comprises a target or cathode and an anode, the cathodes in this case being designated 24-1, 24-2 and 24-n, the break in the view indicating that the total number of electrode pairs will depend upon the requirements of the apparatus and it may be more or less than the number illustrated. The anodes for the respective targets are designated 26-1, 26-2 and 26-n.

In the apparatus 10 of FIG. 1 all of the targets are located above the substrate with the intervening space or gap between target and substrate being designated 28-1, 28-2 and 28-n, this being the location of the sputtering plasma when it is formed. Each of the targets is shielded around all of its exposed surfaces with the exception of that surface that faces the substrate, such shielding being illustrated symbolically at 30-1, 30-2 and 30-n, all of this shielding structure being grounded by means of leads or direct connections, this being indicated at 32. Typical gaps are of the order of a centimeter.

Each of the targets has its own match box as indicated at 34-1, 34-2 and 34-n, all of the match boxes being connected to the r.f. power supply through suitable leads.

With respect to the anodes, in some instances the anodes are connected to ground, the cathode being at a substantial voltage below ground since the configuration is that of a diode, but in accordance with the teachings of said U.S. Pat. No. 4,025,339 it is necessary that the anodes be connected to a bias circuit so that they are not quite at ground potential. this may be done by suitable geometric arrangements or by direct biasing connections which are indicated symbolically as leading to bias means 35-1, 35-2 and 35-n.

The web 12 enters the first module or vessel 14 of the apparatus 10 through an air lock 36 which comprises a series of differential air pressure reduction passages each served by a different pump or a different pump stage. The air lock 36 is shown with three lines 38, 40 and 42 leading to individual pumps 43. From the air lock 36 the web of substrate enters the chamber formed in the module 14 in which the web may be cleaned, outgassed, shrunk or otherwise treated before passing into the main sputtering module 18. For example special pumping equipment for outgassing purposes may be connected to the module 14 by the line 44. There may be solvents introduced (not shown) and heaters indicated at 46. These heaters for example may be connected to a heater power source 48 by suitable lines 50. Their purpose is to commence bringing the temperature of the substrate material up to that which it will meet in the main sputtering chamber 18 so that there is no thermal shock which could produce wrinkles in the substrate.

Most of the outgassing, shrinking and cleaning required for a given substrate is applicable to polyester substrate rather than metal. In the case of metal a thorough cleaning and degreasing may be effected in the module 14 but may not be essential since the sputtering process will normally burn off any grease or oil on the surface of the metal.

As indicated, the substrate web 12 follows a tortuous path in the module 14 by means of suitable rollers 52.

From the cleaning module 14 the substrate passes through an air lock 54 similar to the air lock 36 into a tension control device 16 which preferably is contained in a sealed vessel. The tension control device may be one of different structures which are known but is operated in conjunction with drive and guide means disposed along the length of the sputtering module 18. The web 12 may be brought over a tensioning or dancer roller for the necessary control of web tension even though it may elongate or shrink drastically when subjected to the sputtering process. The dancer roller is equipped with angle deflection encoder and dynamometer and will have a torque motor that will allow for automatic regulation of web tension. Tensioning and drive devices may be provided along the length of the sputtering module 18, these being indicated by the series of rollers which may idle and/or drive at 56. Any number of these groups of rollers can be used wherever needed. Connections from the groups of rollers sense tension and provide for driving of the web, this being indicated by the broken line extending from each group at 58 to a control device 60. The control devices are all marked "Drive, Sense" and connected by way of the channels 62 to the tension control module 16. The system is one of error signal feedback and control in a servo sense so that tension and speed are maintained constant throughout the movement of the web through the sputtering module 18.

Between the tension control device 16 and the sputtering module 18 there is another air lock 64 also suitably served by pumps. It should be understood that there are several air reduction passages in each of the air locks and separate lines to separate pumps just as the case of the interlock 36, but all of them are not fully illustrated in order to keep the diagram simple.

The sputtering module 18 is formed of a metal vessel defining a chamber which is provided with the structure that has been described thus far, namely targets, anodes and groups of rollers. Means are provided also for adjusting the exact positions of the targets, such means being designated "Target Control" and being shown as the blocks 66-1, 66-2 and 66-3 connected to their respective targets by the broken lines 68-1, 68-2 and 68-n. In FIG. 1 the connections from the match boxes and the target controls are shown passing through covers or closures 70-1, 70-2 and 70-n. These closures are trapdoors which are sealed over manholes formed in the upper wall 72 of the modules to give access to the targets for replacement and service. A more detailed explanation is included in connection with the description of FIG. 2.

The module or vessel 18 also has connections for enabling pump-down, one being shown at 74 leading to a series of pumps 76 so that the chamber may be evacuated at the beginning of a given run. Sputter gas is introduced by way of the line 78 through a valve 83 and controlled by a regulator 81 from a gas supply 84. It may be desired to heat the web as it passes through the sputtering module 18 or even to cool the same if desired. Only the heaters are shown at 86 but, these being served by the same power supply 48 as other heaters in the apparatus. In addition to that apparatus and those components which are shown, the sputtering chamber within the module 18 will contain pressure measuring devices, pressure controls, temperature measuring devices, temperature controls and the like. There will be thickness monitors for the sputtered deposit and although only one inlet is shown for the sputter gas supply, there will be several of these. Likewise, because of the size of the module 18, there may be more than one pumping outlet such as 74.

Additional supports for the web may be provided in the form of plates over which the web may move so that it does not sag as for example in the case of a heavy substrate such as metal.

In the case of a substrate web which is to have several coatings or layers applied thereto, there may be more than one module or vessel such as shown at 18, each module being individually arranged to produce its own condition so that the particular material which is going to be applied will be applied without contamination from other modules.

For example, the module shown in FIG. 1 may comprise six or seven electrode pairs. The first pair which comprises the cathode 24-1 and the anode 26-1 may be used to sputter a flash of cadmium sulfide onto the polyester substrate 12. It could have substantially smaller electrodes than the others and the surrounding portion of the chamber may be partitioned off from the next set of electrodes by a suitable wall or header with an additional air lock through which the web can pass. This would then require only the addition of the wall or partition just at about the location of the second set of rollers 56.

Continuing further, if this same web was to have an indium-tin oxide layer applied thereto, the cathode 24-2 could be indium-tin oxide and the layer will be sputtered as the substrate passes the cathode 24-2 the anode 26-2. Again, the surrounding area may be isolated from the remainder of the chambers formed in the module 18 by suitable partitions, air locks, etc. Finally, all the rest of the cathode electrode pairs in the module 18 may have cadmium sulfide coating applied thereby so that when the substrate emerges at the right-hand end of the module 18 it will have all three layers or coatings applied as a continuous process.

The final module or section of the apparatus 10 in this case is designated 20. Substrate 12 passes through yet another air lock 80 into a chamber which could have several pieces of equipment therein. If, for example, the substrate is an insulating material as in the case of polyester, there may be a charge which has accumulated on the coated substrate 12' as a result of the bombardment during sputtering in module 18. A pair of rollers 82 that are grounded can discharge the web at this point. Also, within this chamber, material may be sprayed from the device 84 onto the coated surface of the substrate applying an anti-static compound which derives from a source 86 outside of the module. Another spray device is shown at 88 connected to a source of protective material to prevent scratching, this being shown at 90.

Any other treatment which it is desired to accord to the coated substrate 12' can be done within this module 20.

Finally, the completed product emerges at the right of FIG. 1 through another air lock 92 and can be led to a takeup reel where it is accumulated.

Figure 2:
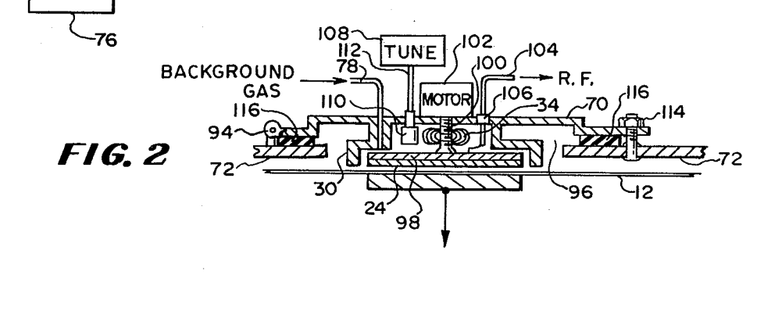
FIG. 2 is a median sectional view taken through a form of trapdoor or closure for mounting a target in accordance with the invention, shown in some detail.

In FIG. 2, there is illustrated a sectional view through a trapdoor or closure 70 showing in detail the general construction thereof. In the first place, it will be noted that the substrate web 12 passes much closer to the upper wall 72 of the module 18 as might be indicated by the diagram of FIG. 1. According to the invention, the structure of the device enables a very low profile so that servicing personnel can readily have access to the top or bottom of the equipment without difficulty.

The trapdoor 70 is hinged at 94 to the upper surface of the wall 72 and is aligned with the manhole 96. A target 24 of the material which is to be sputtered is welded or bolted to a suitable backing such as for example a stainless steel plate 98. The plate is secured to one or more threaded studs 100 that pass through the trapdoor 70 and can be moved up and down either manually or by means of a drive motor 102 or other mechanism. The shielding structure 30 surrounding the target 24 can be integral with the trapdoor 70 and may be provided with a pipe or conduit 78 that is the equivalent of the line 78 shown in FIG. 1. Background gas is preferably expelled into the chamber of the module 18 adjacent to the target so as to pass over the target.

The space between the plate 98 and the trapdoor 70 is preferably occupied by the particular match box 34 which serves this target and it may comprise coils and condensers. An r.f. connection 104 passes through a suitable insulating member 106 to enable the r.f. power supply 22 to be connected thereto. A tuning device 108 is arranged to tune the match box 34 as by operating a vacuum capacitor 110 through a shaft 112.

At 114 there are fastening means connecting to the upper wall 72 so that the trapdoor 70 can be sealed in place when desired. Gaskets are shown at 116.

It will be appreciated that the conditions for applying the coating or coatings to the substrate 12 are ideal since they are never changed throughout a run. The substrate may be placed into optimum condition to receive the coatings and there will be no contamination because it never passes through the open air.

If desired, there may be a provision for sputter etching or back sputtering with another set of electrodes prior to the substrate entering the sputtering chamber 18 or by the use of a separate set of electrodes before any coating occurs.

In addition to giving access to the cathode, the trapdoors 70-1, 70-2 and 70-n give free access to the roller and anode assemblies for cleaning and inspection and adjustment. Trapdoors and manholes may be provided on the bottom of the vessel 18.

Figure 3:
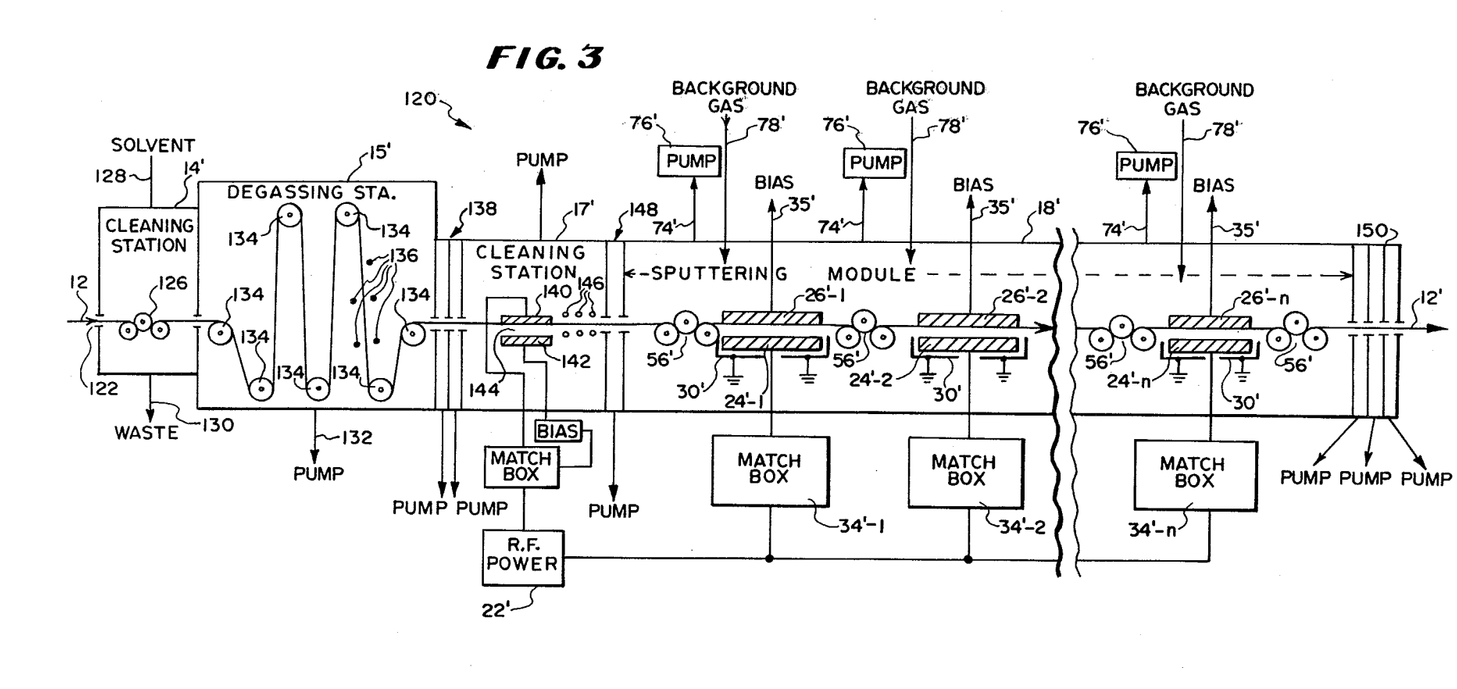
FIG. 3 is a view similar to that of FIG. 1 but of a different form of the invention.

FIG. 3 is a much simpler view of a modified form of the invention.

In FIG. 3 an apparatus 120 is illustrated in which four different modules or vessels are included.

In this case, the uncoated substrate 12 enters on the left, passes through an air lock 122 into a cleaning station 14' where there is a series of rollers 126. Solvent is introduced at 128 and withdrawn at 130 to clean the substrate which is assumed for example to the metal. At the cleaning station 14' the substrate passes into a degassing station 15' where any occluded gases are withdrawn by suitable pumps as indicated at 132. By means of a series of rollers 134, the substrate is caused to move in a tortuous path so that it will be subjected to the pumping process for a substantial period of time. If desired, heaters 136 may be used to bring the substrate up to temperature gradually.

From the degassing station 15 the substrate passes through another air lock 138 and into a cleaning station 17' which is intended to back sputter the substrate. It will be noted from the construction of the sputtering module 18' that in this case the targets are below the substrate and the anodes above making the substrate, itself, the functional anode. Anodes are designated 26'-1, 26'-2 and 26'-n, while the cathodes are designated 24'-1, 24'-2 and 24'-n.

Coming back to the cleaning station 17', the cathode 140 is right up against the rear surface of the substrate since now the substrate surface which is to be coated faces downwardly. The anode 142 is spaced from the substrate. Plasma will appear in the space 144 between and by suitable adjustment of voltages, instead of the cathode material being sputtered, actually the material from the bottom surface of the substrate is sputtered towards the anode, so that the process can be effectively described as sputter etching. The cleaning station 17', and particularly the sputtering gap 144 is electrically isolated from the sputtering module 18'. Accordingly, the surface will be very efficiently cleaned.

Thereafter, heaters 146 are shown and the substrate passes through still another air lock 148 into the sputtering module 18'.

The r.f. power source 22' is now shown at the bottom of the view feeding the match boxes 34'-1, 34'-2 and 34'-n. Shown also are pumps 76' for withdrawing gas through the line 74', background gas line 78', groups of rollers 56', shielding 30', bias connection 35', etc.

The completed substrate 12' with the coatings on the bottom rather than the top emerges at the right through the air lock 150.

In the apparatus 120 there may be access doors or closures and manholes at the top of the module 18' or they may be on the bottom to give better access to the cathodes. Basically, the same advantages apply as in the case of the apparatus 10.

Figure 4:
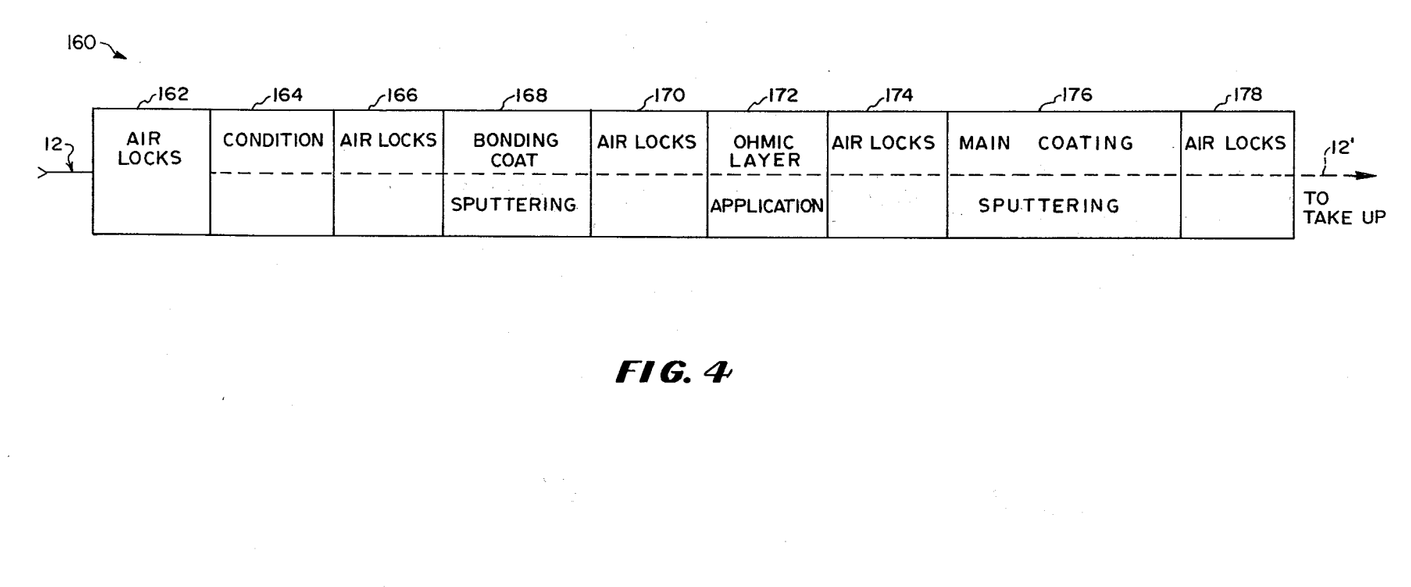
FIG. 4 is a simplified block diagram of still another form of the invention.

FIG. 4 is a more or less simplified block diagram of an apparatus 160 which is to apply three coats or layers to a substrate. The substrate web 12 enters on the left, passes through the air locks 162 into a conditioning chamber 164 and through additional air locks 166 into a sputtering module 168. In the sputtering module 168 the bonding coat is applied after which the substrate passes through additional air locks 170 into a second sputtering module 172 where the ohmic layer is applied.

After the bonding coat and ohmic layer have been applied, the substrate passes through additional air locks 174 into the main sputtering module 176 where the principal coating of photoconductive material is applied. From there the substrate passes through additional air locks to the takeup reel.

Figure 5:
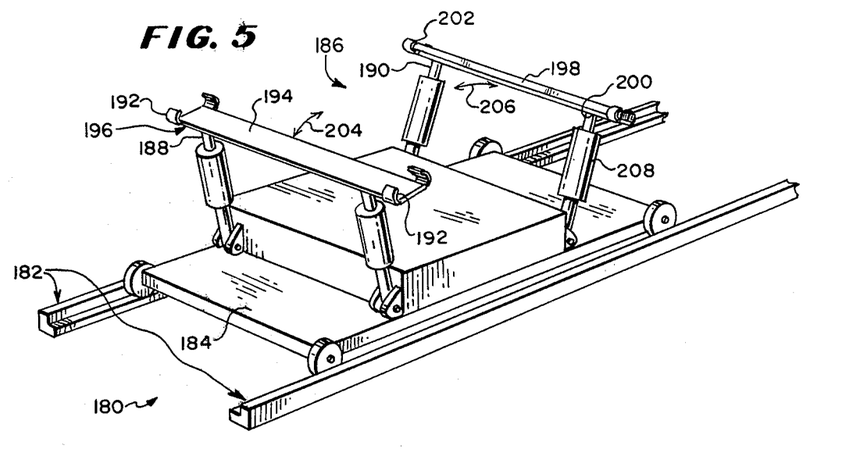
FIG. 5 is a diagrammatic perspective view illustrating means provided by the invention to facilitate removal and replacement of a target.

As mentioned earlier, the doors or closures provided in apparatus 10 and 120 enables access to be easily established for the removal and replacement of targets. One device 180 which can be employed for this purpose is illustrated in FIG. 5. A track 182 is disposed along the length of the sputtering chamber on the side carrying the access doors. Carriage 184 is ridable on the track 182 so as to position the target raising and lowering device 186 adjacent any selected one of the access doors. The raising and lowering device 186 includes a pair of support arms 188, 190. A clamp 192 is carried on platform 194 secured at the free end 196 of arm 188. A similar platform 198 is secured at the free end 200 of arm 190. Clamp 202 is carried on platform 198. Arms 188, 190 are selectively movable in the direction of arrows 204, 206 respectively.

The carriage 184 is placed adjacent the selected access opening.

A fresh target is mounted to platform 198. Platform 194 is raised to enter the access opening for receiving the target to be removed. Platform 194, then is lowered and the platform 198 raised to position the replacement target. After installation, the arm 190 then is lowered. The raising and lowering of arms 188, 190 can be effected by hydraulic means represented by reference 208 or other electromechanical devices (not shown).

Stops, detents or the like can be provided to accurately indicate the exact location for aligning the carriage with the selected access opening.

A vacuum system can be employed to sweep the length of the interior of the apparatus for exhausting any dust or other contaminants therefrom.

The system includes a nozzle mounted on a movable carrier and connected by way of a flexible hose to a vacuum source, the carrier is guided along the length of the interior of the apparatus so that the nozzle sweeps the same, exhausting the contaminants. The system can be built into the interior of the apparatus or can be arranged exterior thereof, offset therefrom but when required, the carrier can be pivoted into a disposition relative to the interior of the apparatus for guiding the nozzle in the desired sweeping movement. The carrier may be a hang-rail or a track determined by guide rails or the like.

Figure 6:
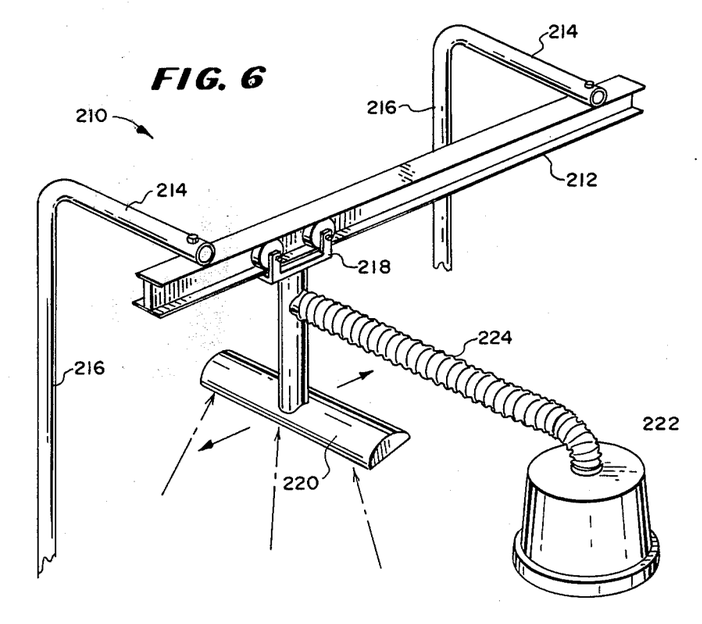
FIG. 6 is a perspective view of a vacuum exhausting system for removing contaminants, dust, etc., from the chambers of the apparatus provided by the invention.

In the system 210 illustrated in FIG. 6, a hang-rail 212 is pivotally mounted on the arms 214 of twin standards 210. Wheeled carriage 218 rides on the hang-rail 212 and a vacuum nozzle 220 is supported from said carriage. Nozzle 220 is coupled to vacuum source 222 by way of flexible hose 224. The standards 216 can be rotated in tandem to position the nozzle 220. System 210 is adapted for use where the interior of the apparatus 10, 120 is rendered fully accessible, as by partial disassembly. Provision of track means interior of the apparatus, with a similar nozzle ridable thereon, can be accommodated within said interior for sweeping movement therealong so that the use of a vacuum exhaust is feasible independent of the nature of the structure defining the respective chambers thereof.

Both the target removing and replacement device 180 and the vacuum system 210 advantageously can be utilized at the same time to increase the overall efficiency of the apparatus by materially decreasing the down-time required for servicing thereof.

In the case of the sputtering of electrophotographic member such as described in U.S. Pat. No. 4,025,339 and the substrate is a web of polyester, the bonding coat is a flash of cadmium sulfide, the ohmic layer is a layer of indium-tin oxide and the main coating is cadmium sulfide.

The invention includes the methods which are described.

Many variations are capable of being made without departing from the spirit or scope of the invention as defined in the appended claims. What it is desired to secure by Letters Patent of the United States is:

I claim:

1. An inline continuous sputtering apparatus for sputtering insulating material onto the surface of a continuous generally planar web of flexible substrate material passing through the apparatus which comprises:

A. a source of r.f. power of megahertz frequency,

B. a sputtering vessel having grounded metallic walls defining a horizontally extending elongate sputtering chamber, there being at least top, bottom and opposite end walls, C. first air lock means in both said opposite end walls and pump means for evacuating said first air lock means, said first air lock means isolating said sputtering chamber and together are adapted to receive and provide for the uninterrupted continuous passage of a flexible single web of substrate material into the sputtering chamber from the exterior of the sputtering chamber through one of the opposite end walls thereof and out of the sputtering chamber through the other of said opposite end walls thereof by way of said first air lock means wthout affecting the physical conditions on the interior of the chamber and without exposure to ambient air, D. means within the chamber for supporting and guiding the web of substrate material throughout its continuous passage into, through and out of the sputtering chamber, E. a plurality of electrode pairs in the sputtering chamber spaced horizontally one pair from the other along the length of the sputtering chamber, each electrode pair comprising a generally planar target formed of the substance to be sputtered onto the web surface and an opposed anode facing the target and having a generally conforming planar configuration and spaced from said target defining a sputtering gap, within which sputtering plasma is adapted to form, the continuous web adapted to be led through an individual sputtering plasma vapor cloud formed in each sputtering gap,
  i. each target having grounded shielding surrounding the same but for its planar exposed surface which faces the anode and defines the sputtering gap therewith,
  ii. each target being mounted to the walls of the sputtering vessel electrically insulated therefrom,
F. means coupling the source of r.f. power to all of the electrode pairs and including at least an individual match box coupled to each respective electrode pair for enabling efficient power transfer from the said source to the electrode pairs, each individual match box having one direct connection to the target electrode of the electrode pair it serves,
G. means for driving the web of substrate material through the chamber of the vessel in a continuous movement successively through each plasma vapor cloud in each sputtering gap,
H. means for connecting the anode of each electrode pair to substantially ground potential, and
I. means cooperating with said r.f. power source and electrode pairs for establishing a sputtering condition within all said gaps.

2. The sputtering apparatus as claimed in claim 1 in which the targets are arranged in the chamber with all of the exposed surfaces facing downward and the cooperating anode surface facing upward such that the web will pass over the anode surfaces during its movement.

3. The sputtering apparatus as claimed in claim 1 in which the targets are arranged in the chamber with all of the exposed surfaces facing upward and the cooperating anode surfaces facing downward, said supporting and guiding means being effective to maintain said gaps with the web spaced from the targets during its passage through said chamber.

4. The sputtering apparatus as claimed in claim 1 in which there is a manhole in the walls of the vessel in the vicinity of each pair of electrodes to enable access to said electrodes and removable closures for sealing each respective manhole during sputtering operation of the apparatus.

5. The sputtering apparatus as claimed in claim 1 in which there is a manhole in at least one of said top and bottom walls of the vessel in the vicinity of each pair of electrodes to enable access to said electrodes and a separate removable closure for sealing each respective manhole during sputtering operation of the apparatus.

6. The sputtering apparatus as claimed in claim 1 in which there is a manhole in the top wall of the vessel in the vicinity of each pair of electrodes to enable access to said electrodes and a separate removable closure for sealing each respective manhole during sputtering operation of the apparatus.

7. The sputtering apparatus as claimed in claim 6 in which each target is mounted on the bottom of an individual closure, the said individual closure being hinged along an edge thereof so that the said individual closure swings relative to said top wall upon removal, carrying its mounted target out of the chamber and giving direct access thereto.

8. The sputtering apparatus as claimed in claim 7 in which the said match box individual to each target is also mounted to the said individual closure which mounts said target served by said match box.

9. The sputtering apparatus as claimed in claim 7 in which means are provided on each individual closure to adjust the physical disposition of the said target carried thereby.

10. The sputtering apparatus as claimed in claim 7 in which said means cooperating with said r.f. source and electrode pairs comprise structure for introducing background sputtering gas to said chamber and there is a respective conduit for said gas leading to each said individual closure such that the gas will pass into the chamber in proximity to the target carried by said individual closure.

11. The apparatus as claimed in claim 1 in which said apparatus includes tension control means for maintaining uniform tension in said web during its passage through the apparatus.

12. The apparatus as claimed in claim 1 in which means are provided for sputter etching the web before it enters said gaps.

13. The apparatus as claimed in claim 1 and a cleaning station arranged adjacent said one end of the chamber and comprising a separate cleaning vessel through which the web passes prior to entering the sputtering vessel, said separate cleaning vessel having an entrance end and an exit end, second air lock means at said entrance end and pump means therefor, said first air lock means coupling said exit end to said sputtering chamber at the entrance to said sputtering chamber, sputter etching means disposed within said separate cleaning vessel and being electrically isolated from said respective spaced electrode pairs which define said sputtering gaps whereby the web passes directly from said cleaning station to the sputtering chamber of the sputtering vessel without entering the ambient atmosphere.

14. The apparatus as claimed in claim 1 in which web-cleaning means are contained within the sputtering chamber and located adjacent the entrance thereof whereby the web will pass said last means for cleaning before passing into said sputtering gaps.

15. The apparatus as claimed in claim 1 and means establishing selective access to said electrodes and track means, carriage means ridable on said track means and raising and lowering means mounted on said carriage means for facilitating changing of said targets through said access means.

16. The apparatus as claimed in claim 1 and vacuum exhaust means coupled to said apparatus in communication with the interior thereof for removing any contaminants therein and said vacuum exhaust means includes carrier and guide means arranged for disposition proximate said interior, vacuum nozzle means carried by said carrier and guide means, a source of vacuum and conduit means coupling said nozzle to said vacuum source.

17. The apparatus as claimed in claim 16 and said nozzle means being capable of movement in a sweeping motion along the length of said apparatus.

18. An inline continuous sputtering apparatus for sputtering insulating material onto the surface of a continuous web of flexible substrate material passing through the apparatus from an exterior supply thereof to an exterior take-up therefor, said apparatus comprising:

A. an exterior supply of flexible substrate material and an exterior take-up therefor, B. a source of r.f. power of megahertz frequency, C. a sputtering vessel having grounded metallic walls defining a horizontally extending elongate sputtering chamber, there being at least top, bottom and opposite end walls, D. sputtering air lock means in the opposite end walls of said sputtering vessel defining an entrance and an exit therefor and pump means for evacuating said air lock means, said air lock means and sputtering chamber coacting to isolate the sputtering chamber, same being adapted to receive and provide for continuous passage of the web of flexible substrate material from the exterior supply into the sputtering chamber at said entrance and out of the sputtering chamber at said exit and for receipt by the exterior take-up without affecting the physical conditions on the interior of the chamber, E. support and guide means within the sputtering chamber for supporting and guiding the web of flexible substrate material during its continuous passage horizontally into, through and out of each sputtering gap in said sputtering chamber, F. plural electrode pairs, each electrode pair comprising a target formed of the material to be deposited onto the web and an opposed anode facing the target and having a generally conforming configuration and spaced from said target thereby defining a sputtering gap, said electrode pairs being disposed within said sputtering vessel spaced horizontally along the length of the sputtering chamber and providing successive horizontally spaced sputtering gaps through which the web passes and the electrode pairs being coupled to said source of r.f. power generating successive horizontally spaced individual plasma vapor clouds in each respective sputtering gap, G. a web conditioning vessel having opposite first and second end walls, means defining an entrance through said first end wall of the web conditioning vessel, means defining an exit through the second end wall of said web conditioning vessel, means for leading the web through said entrance, through said conditioning vessel and out the exit thereof to the sputtering vessel, the web being capable of being conditioned within said conditioning vessel during transit therethrough, H. conditioning vessel air lock means in said first end wall of said conditioning vessel and pump means therefor, the second end wall of said conditioning vessel being juxtaposed relative to the entrance end of said sputtering vessel, said sputtering vessel air lock means being coupled to said exit of said web conditioning vessel at the entrance to said sputtering chamber whereby to enable passage of said web from the conditioning vessel to said sputtering chamber without entering the ambient atmosphere surrounding the apparatus, I. means for driving the web continuously through said conditioning vessel and through the successive horizontally spaced sputtering gaps and the plasma vapor clouds therewithin the sputtering vessel and J. means cooperating with said r.f. power source and electrode pairs for establishing the respective sputtering conditions within said sputtering gaps.

19. The apparatus as claimed in claim 18 in which there are tension control means for maintaining uniform tension in said web during its passage through said apparatus.

20. The apparatus as claimed in claim 19 in which said tension control means include a vessel in alignment with said conditioning and sputtering vessels such that the web passes through the tension control vessel and air locks are provided at the entrance and exit of said tension control vessel to prevent contamination of said web while passing through, there being pump means serving said last mentioned air locks.

21. The apparatus as claimed in claim 19 in which there is a servo system including driving and sensing means within the sputtering chamber along the length of said web while passing through the chamber cooperating with said tension control means, there being feed back means connected between said driving and sensing means and tension control means.

22. A method of sputtering a sputterable material onto a continuously moving flexible web of substrate material from an exterior supply to an exterior take-up, said method comprising the steps of A. preconditioning the web while moving the same horizontally from the supply through ambient air into an enclosed chamber where the preconditioning occurs, B. driving the web from said enclosed chamber in a continuous movement through a plurality of sputtering plasma clouds spaced horizontally apart within a second enclosed chamber, each plasma cloud being formed between an electrode pair comprising a target formed of the material to be deposited onto the web and an opposed anode facing the target and having a generally conforming configuration and spaced from said target thereby defining a sputtering gap, C. Locking the chambers and web from the ambient air while the web passes through said chambers and between chambers, but permitting passage thereof, D. maintaining uniform r.f. sputtering conditions along with the establishment of said plasma clouds whereby to apply a coating of sputtered material upon a surface of said web as it passes through said sputtering gaps, E. passing said web in coated condition out of said sputtering chamber and accumulating the same on the take-up.

23. The method as claimed in claim 22 in which a bias is applied during sputtering.

24. The method as claimed in claim 22 in which constant tension is maintained on said web while moving through said chambers.

25. The method as claimed in claim 22 in which a plurality of coatings of different materials are applied successively to said web while moving through said chambers.

26. The method as claimed in claim 22 in which the web is sputter etched prior to the first coating application.

27. The method of sputtering a sputterable material onto a moving flexible web of substrate material from an exterior supply to an exterior take-up comprising the steps of:

A. cleaning the web while moving the same horizontally from the exterior supply through ambient air into an enclosed cleaning chamber where cleaning occurs, B. driving the web from said enclosed chamber in a continuous movement from the cleaning chamber without exposure to ambient air into a second enclosed chamber, C. sputter-etching the web while passing same through said second enclosed chamber, D. driving the web from said second enclosed chamber to a third enclosed chamber without exposure to ambient air and passing the web in a continuous movement through at least a pair of horizontally spaced sputtering plasma vapor clouds formed within said third enclosed chamber, each plasma vapor cloud being formed between an electrode pair comprising a target formed of the material to be deposited onto the web and an opposed anode facing the target and having a generally conforming configuration and spaced from said target thereby defining a sputtering gap, E. r.f. sputtering a coating of sputterable material on the web while passing the web successively through the spaced sputtering plasma vapor clouds within said third enclosed chamber, F. air-locking the passages to and from said chamber from ambient air enabling passage of the web through and between said chambers without exposure to ambient air and G. passing the web in its coated condition from the third enclosed chamber through an air-lock and accumulating the coated web on a take-up located exterior of said apparatus.

28. The method as claimed in claim 27 in which additional sputtering plasma vapor clouds are established in separate chambers, the chambers being arranged in sequence.

29. The method as claimed in claim 27 in which plural successive coating layers of different materials are applied after sputter etching.

* * * * *